United States Patent [19]

Watanabe

[11] Patent Number: 5,231,604
[45] Date of Patent: Jul. 27, 1993

[54] SEMICONDUCTOR MEMORY DEVICE HAVING COLUMN REDUNDANCY SYSTEM

[75] Inventor: Makoto Watanabe, Kanagawa, Japan

[73] Assignee: Sony Corporation, Tokyo, Japan

[21] Appl. No.: 643,127

[22] Filed: Jan. 18, 1991

[30] Foreign Application Priority Data

Jan. 18, 1990 [JP] Japan .................................. 2-9104

[51] Int. Cl.$^5$ ............................................ G11C 13/00
[52] U.S. Cl. ................................ 365/189.05; 365/210; 365/230.08
[58] Field of Search ....................... 365/189.01, 189.05, 365/189.08, 210, 230.01, 230.08

[56] References Cited

U.S. PATENT DOCUMENTS 3,763,480 10/1973 Weimer ................................ 365/238
4,868,789 9/1989 MacDonald .

FOREIGN PATENT DOCUMENTS 0315257 5/1989 European Pat. Off. .

Primary Examiner—Terrell W. Fears
Attorney, Agent, or Firm—Hill, Steadman & Simpson

[57] ABSTRACT

A semiconductor memory device for handling video data comprises a column redundancy system for substituting erroneous bits. In one embodiment, the memory device comprises a memory cell array and a register for serial-parallel and/or parallel-serial conversion. There provide a redundant column section adjoined to the memory cell array and a redundant latch section functioning as a part of the register. The register includes a plurality of serially connected flipflops. Data are transferred in idle at the flipflop which is responded to a defective column of the memory cell array. In another embodiment, the memory device comprises a memory cell array and a read register to output data serially. Erroneous data of a defective column of the array are replaced by correlative data at the read register.

11 Claims, 9 Drawing Sheets (PRIOR ART) FIG.1

SEMICONDUCTOR MEMORY DEVICE HAVING COLUMN REDUNDANCY SYSTEM

BACKGROUND OF THE INVENTION

1. Field of the Invention

This invention relates to a semiconductor memory device having a column redundancy system, and more particularly, to a semiconductor memory device for use as a video memory in which data are inputted and outputted serially and the data are converted into or from parallel data therein.

2. Description of the Prior Art

In general, a video memory such as a field memory has a memory cell array composed of DRAM type cells and is adapted to perform serial-parallel conversion and parallel-serial conversion during writing and reading, respectively, by means of a register, for inputting or outputting the serial data.

With such video memory, defects tend to be produced in memory cells because of the process, and a redundancy circuit is provided for rescuing the erroneous bits where the defect has occurred. In general, the column decoder is dispensed with a video memory because one-row data are written or read out collectively to or from the memory cell array. Therefore, if the defective memory cell column is exchanged to the redundancy circuit, since the addresses cannot be specified directly to the redundancy circuit, it becomes necessary to add various circuits.

FIG. 1 shows substantial portions of an example of the conventional memory device having a column redundant section. A read shift register 102 and a write shift register 103 are provided in a RAM section 101 having a memory cell array for data storage. In the read shift register 102, data are transmitted in parallel from the RAM section 101 and thence outputted serially. Data are inputted serially in the write shift register 103 and transferred in parallel to the RAM section 101. The RAM section 101 and a column redundant section 104 provided thereat are associated with a row decoder 105 to effect row section. The column redundant section 104 is adapted for rescuing column defects in RAM section 101 by row-by-row substitution and data to be stored intrinsically in the column defective portion are stored in the column redundant section 104. For such substitution, the video memory device is provided with a fuse ROM 110 for storing column-defective column data (column address), a write address comparator circuit 111W, a read addresses comparator circuit 111R, a write switching circuit 112W, a read switching circuit 112R, a write redundancy latch 113W and a read redundancy latch 113R. In the comparator circuits 111W, 111R, address data from address generators 106, 107 are compared with column-defective column data from fuse ROM 110 and, in case of coincidence of these data, the switching circuits 112W, 112R are switched to the latch side. As a result, data are written into the column redundant section 104, and data are read out from the column redundant section 104.

With the above described conventional video memory device, fuse ROM 110, comparator circuits 111R, 111W, switching circuits 112W, 112R and so forth, are necessitated for controlling the column redundant section 104, so that the corresponding area on the chip has been necessitated.

On the other hand, the read-out erroneous data are replaced by the redundant data by the switching circuit 112R with consumption of excess time.

SUMMARY OF THE INVENTION

It is an object of the present invention to provide an improved semiconductor memory device having a column redundancy system in which erroneous bits are substituted without excessive consumption of chip area and time.

According to one embodiment of the present invention, the semiconductor memory device comprises a register consisting of a plurality of serially connected flipflops, the register being capable of inputting and outputting data in parallel to or from an array of memory cells and being also capable of inputting and outputting data in series to or from the outside of the chip, characterized in that the memory device includes a redundant column section, and a redundant latch section associated with the redundant column section, and in that data are transferred in idle in the flipflop circuit of the register associated with the memory cell column having erroneous bit. The transferring in idle or the passing the data is controlled by a erroneous bit data storage circuit in which the column data of the erroneous bits are stored.

According to another embodiment of the present invention, there provide a memory device handling video data characterized in that, on the basis of signals from erroneous bit data storage means storing the column data of the erroneous bits, the erroneous bits read out from the memory cell are read after replacement by correlative data bits. The correlative data bits may be enumerated by, for example, data bits one bit before, data bits one bit after, data bits one field before, or data bits one frame after.

PREFERRED EMBODIMENT OF THE INVENTION

First Embodiment

Figure 1:
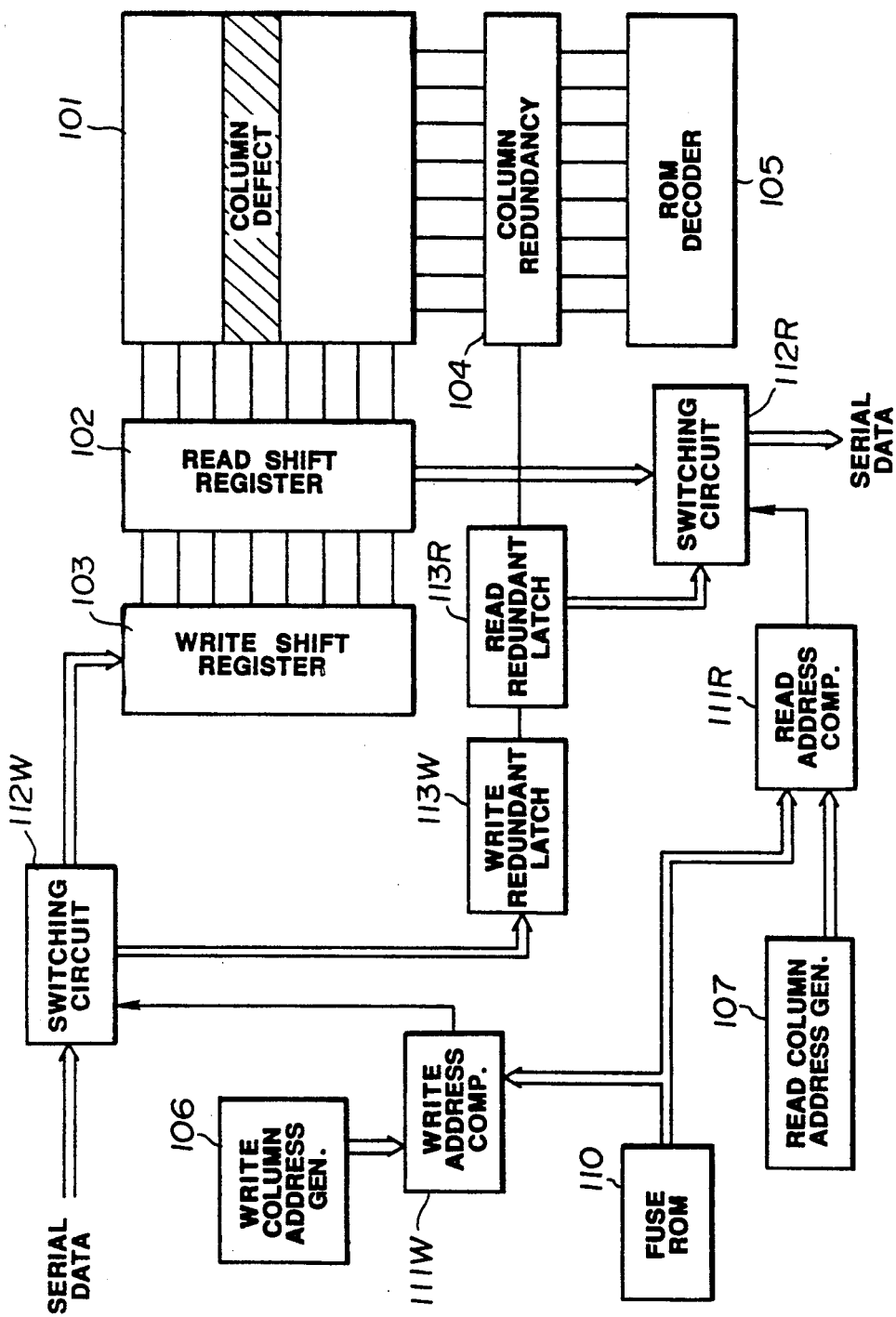
FIG. 1 is a block diagram showing an example of a conventional memory device.
Figure 2:
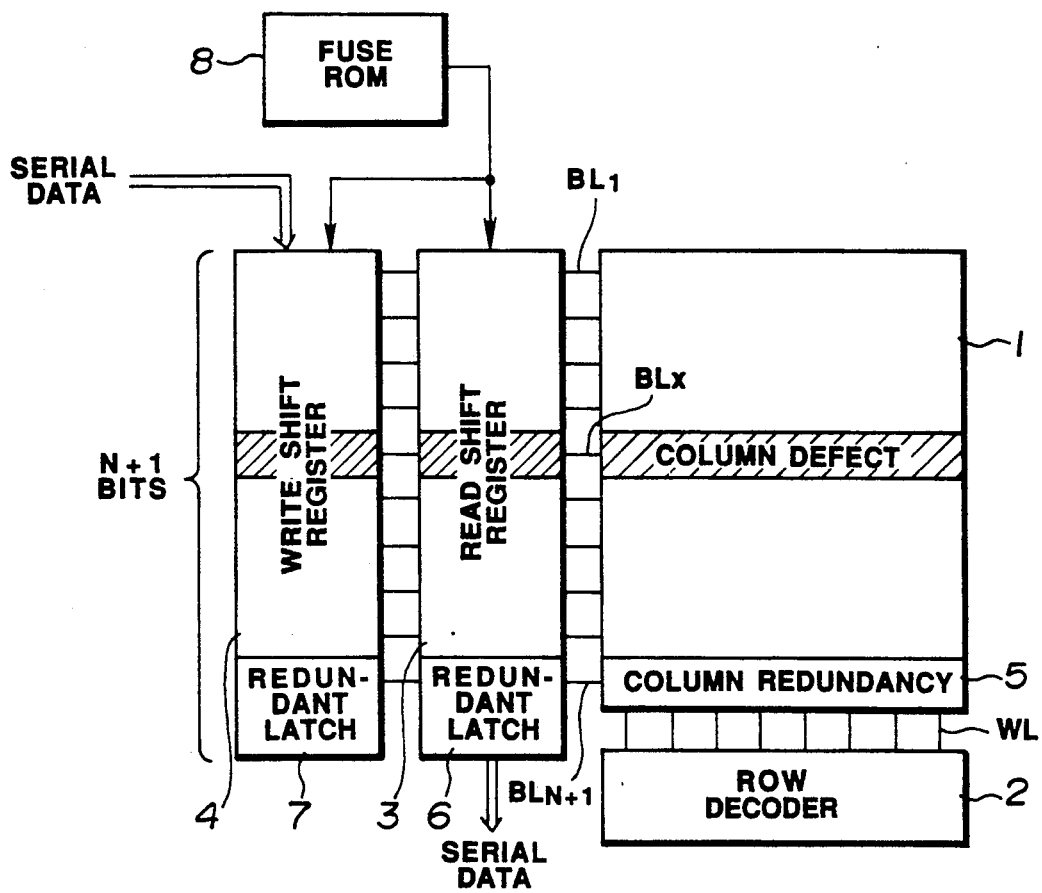
FIG. 2 is a block diagram showing an example of the memory device according to the present invention.

The memory device of the present embodiment has a general construction as shown in FIG. 2 for rescuing column defects.

First explaining the circuit construction, the memory device of the present embodiment includes a memory cell array 1 having DRAM type cells and memory cells are arrayed in a matrix configuration in the memory cell array 1. The number of columns of the memory cells in (N+1), where N is a natural number. The one end column among these (N+1) columns is a column redundant section 5 for rescuing column defects.

A plurality of word lines WL are provided for row selection in the memory cell array 1, these word lines being formed in a parallel pattern as the gates of access transistors, not shown, of the memory cells. The word lines WL are connected to a row decoder 2 which raises the potential of the word line WL to be selected in accordance with address signals.

The memory cell array 1 is also provided with a plurality of bit lines $BL_1, \ldots, BL_{N+1}$ extending in parallel with one another in a direction normal to the word lines WL. These bit lines are used to effect data readout or reading. These bit lines $BL_1, \ldots, BL_{N+1}$ are connected to capacitances in the memory cells by means of access transistors so that their voltage is amplified by sense amplifiers, not shown. In the present embodiment, since only one redundancy bit line is provided, the number of the bit lines is (N+1). Meanwhile, the number of the redundant bit lines need not be one, but may be plural, in which case the number of the column-defective memory cell columns corresponding to the number of the redundant bit lines may be replaced.

The bit lines $BL_1, \ldots, BL_{N+1}$ are connected to the read shift register 3 and the write shift register 4. The read shift register 3 is used for outputting the parallel data from the bit lines $BL_1, \ldots, BL_{N+1}$ after conversion thereof into serial data. As will be explained subsequently, the reading shift register 3 is composed of (N+1) series connected flipflop circuits, the end part of which is a redundant latch section 6 for latching data from the column redundant section 5. The write shift register 4 is used for converting serial data from outside into parallel data and writing the converted data into memory cells by means of the bit lines $BL_1, \ldots, BL_{N+1}$. This write shift register 4 is similarly composed of (N+1) serially connected flipflop circuits, the end part of which is a redundant latch section 7 for latching data to be transferred to the column redundant section 5.

The memory device of the present embodiment includes a fuse ROM 8 as erroneous bit data storage means for storing column data for defective bits, that is the defective column address. This fuse ROM 8 is a circuit for storage of address signals by the pattern of fuse connection and disconnection of the previously melted fuse or fuses, such that, if the column of the column address x is defective, as indicated by hatching in FIG. 2, a signal to the effect that the column of the x'th address is in error is outputted from fuse ROM 8.

With the memory device of the present embodiment, having the above described detailed structure, if the column of the x'th address is defective, data are transferred in idleness in the corresponding portions of the shift registers 3 and 4 and data entry or outputting is not performed between the shift register and the memory cell having the x'th address to prevent the defective bit from occurring. The hatching areas in the shift registers 3 and 4 represent diagrammatically the portions of the register where idle transfer is performed.

Figure 3:
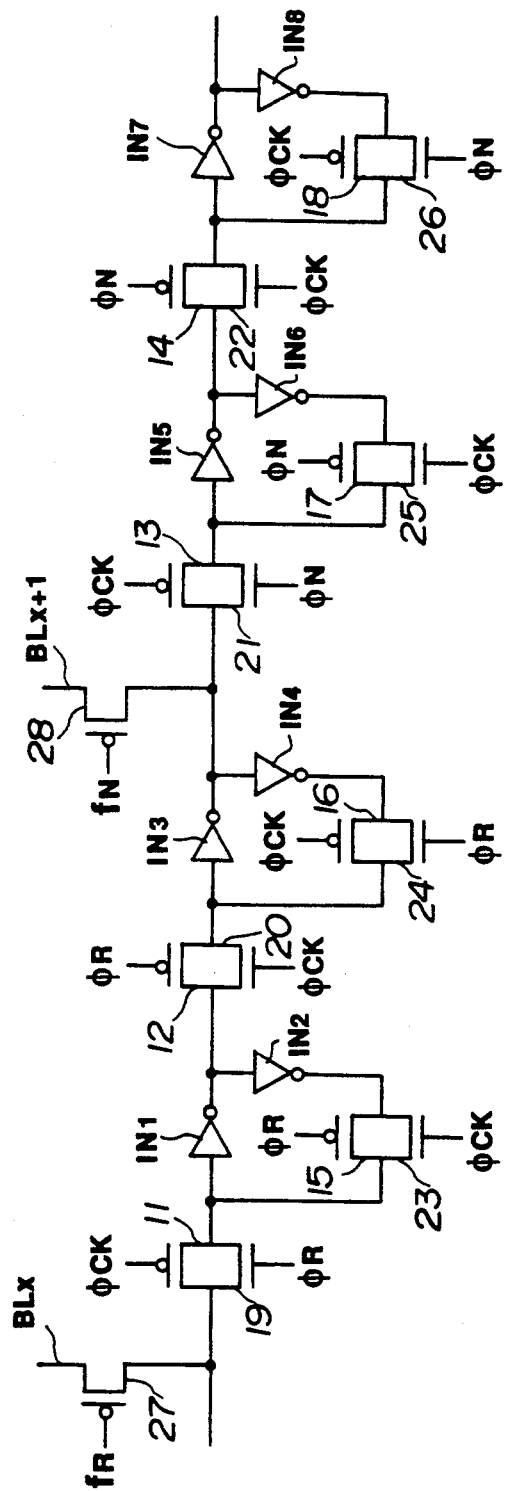
FIG. 3 is a circuit diagram showing the terminal section of the shift register.
Figure 4:
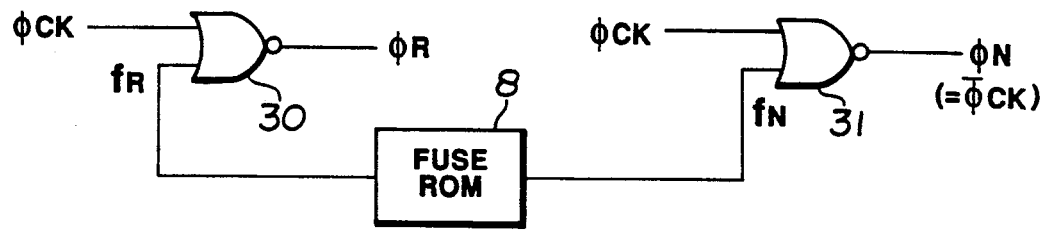
FIG. 4 is a circuit diagram of a signal generating circuit for generating signals for operating the circuit of FIG. 3.

The shift register is explained in more detail by referring to FIGS. 3 and 4.

As shown in FIG. 3, the shift register is so arranged and constructed that a forward stage D-flipflop and a rear stage of D-flipflop are associated with each bit line. Inverters $In_1$ to $In_8$ are arranged for constituting the D-flipflops. That is, a set of inverters $In_1$ and $In_2$, a set of inverters $In_3$ and $In_4$, a set of inverter $In_5$ and $In_6$ and a set of inverters $In_7$ and $In_8$ have their input terminals connected to the output terminals to constitute the D-flipflops. Between the adjoining D-flipflops, there are provided CMOS switch type transfer gates constituted by pMOS transistors 11 to 14 and nMOS transistors 19 to 22. In the latch loops of the D-flipflops, there are also provided CMOS switch type transfer gates which are constituted by pMOS transistors 15 to 18 and nMOS transistors 23 to 26. To the input side of the forward stage D-flipflop are connected bit lines $BL_x$ and $BL_{x+1}$ by means of pMOS transistors 27 and 28 functioning as switches.

The register operation differs between the D-flipflop for bit line $BL_x$ of the memory cell column where column defects have occurred and the D-flipflop for bit line $BL_{x+1}$ of the memory cell column performing the regular operation. Above all, idle transfer or passing occurs in the D-flipflop of the bit line $BL_x$.

FIG. 4 shows a signal generator for actuating the MOS transistors 11 to 26. The aforementioned fuse ROM 8 generates a signal $f_R$ which is to be supplied to the D-flipflop of the bit line $BL_x$ of the memory cell column where column defects have occurred while generating a signal $f_N$ which is to be supplied to the D-flipflop of the bit line $BL_{x+1}$ of the memory cell column performing a regular operation. The signal $f_R$ is always at an "H" (high) level and is, in effect, a defective column address signal. Conversely, the signal $f_N$ is always at an "L" (low) level and is supplied to all of the regular memory cell columns other than the bit line $BL_x$. These signals $f_R$, $f_N$ are supplied to NOR gates 30, 31, to the other input terminals of which a clock signal $\phi_{CK}$ alternating between the "H" level and the "L" level at a constant period. Thus the output of the NOR gate 30, supplied with the signal $f_R$, is always a signal $\phi_R$ at the "L" level, whereas the output of the NOR gate 31, supplied with the signal $f_N$, is always a signal $\phi_N$ inverted from clock signal $\phi_{CK}$.

Explaining the operation of the flipflop which performs a normal operation, the signal $f_N$ which is always at the "L" level is supplied to the gate of the pMOS transistor 28 between the bit line $BL_{x+1}$, so that the pMOS transistor 28 is always turned on. The signal $\phi_{CK}$ is supplied to the gate of the pMOS transistor 13 ahead of the forward stage D-flipflop, while the signal $\phi_N$ is supplied to the gate of the nMOS transistor 21 so that, when the signal $\phi_{CK}$ is at the "L" level, this CMOS switch is turned on. Thus the inverter $In_5$ generates an inverted output, while the inverter $In_6$ generates a inverted output of said inverted output. However, when the signal $\phi_{CK}$ is at the "L" level, pMOS transistors 14, 17 and nMOS transistors 22, 25 are all turned off so that the data are not latched. Next, when the signal $\phi_{CK}$ rises from the "L" level to the "H" level, pMOS transistor 17 and nMOS transistor 25 are turned on, while pMOS transistor 13 and nMOS transistor 21 are turned off, so that the data are latched. Simultaneously, pMOS transistor 14 and nMOS transistor 22 are turned on, so that data are transferred from the forward stage D-flipflop to the rear stage D-flipflop and the output of the inverter In$_7$ is at the same level as the input of the inverter In$_5$. The signal $\phi_{CK}$ falls from the "H" level to the "L" level and the rear stage D-flipflop is latched by means of MOS transistors 18, 26, at the same time that the MOS transistors 14, 22, acting as switches between the forward stage and the rear stage, are turned off, while the MOS transistors 13, 21, acting as the transfer gates at the input side of the forward stage D-flipflop, are turned on. Date are transferred by the above described cyclic operation. Meanwhile, the operation of the flipflop corresponding to the normal memory cell is the same as that of the conventional shift register.

The idle transfer operation of the flipflop associated with the bit line BL$_x$ of the memory cell column suffering from column defects is hereinafter explained. First, the signal f$_R$ which is always at the "H" level is supplied to the gate of the pMOS transistor 27 between the bit line BL$_x$ and the D-flipflop, so that the pMOS transistor 27 is always turned off. This is tantamount to the bit line BL$_x$ with the defective column being disconnected. The D-flipflop, transferring in idleness, should intrinsically be supplied with the signal $\phi_N$, is supplied with the signal $\phi_R$ which is always at the "L" level, so that it performs an idle transfer operation without data latching. That is, of the flipflops associated with the bit lines BL$_x$, the nMOS transistors 19, 24 are always turned off, while the pMOS transistors 12, 15 are always turned on. Since the pMOS transistor 12 is always turned on, the signal inputted to the inverter In$_1$ directly appears at the output of the inverter In$_3$, without regard to the level of the signal $\phi_{CK}$. Thus the data are always latched in the forward stage D-flipflop and data are transmitted to the output of the inverter In$_3$ when the pMOS transistor 11 is turned on. This means that, when the D-flipflop at the forward stage of the bit line BL$_x$ is in the sampling state, the D-flipflop of the forward stage of the bit line BL$_{x+1}$ is also in the sampling state simultaneously with the same data, so that data are transferred by skipping over one column register.

Thus, with the memory device of the present embodiment, data are transferred at the register associated with the memory cell column suffering from column defect as passing through the register without latching. Data are transferred in excess through one register over shift registers 3 and 4, while redundant latches 6, 7 positively latch these data between the redundant column section 5. Thus the circuit for switching control, such as switching circuits or address comparators may be eliminated to save the area on the chip. Since these circuits are eliminated, high-speed read-out is also enabled.

Meanwhile, if there is no defective column, idle transfer may be made between the redundant latch sections 6 and 7 of the register. Although one memory cell column with the defective column is replaced by one column, this is not limitative and a plurality of columns of the column redundant sections may be provided to cope with several defective columns. The number of shift registers is not limited to each one of the read and write shift register.

Second Embodiment

The present embodiment is a modification of the first embodiment in which the signal to be supplied to the transfer gate of the shift register is modified. The circuit construction of the shift register shown in FIG. 5 is the same as the circuit construction shown in FIG. 3 except that the pMOS transistors 27, 28 are changed to nMOS transistors 34, 35, so that the same reference numerals are used and the detailed description thereof is omitted.

Figure 6:
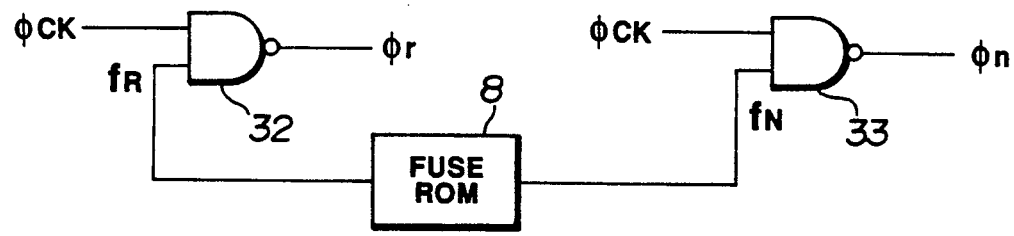
FIG. 6 is a circuit diagram of a signal generating circuit for generating signals actuating the circuit of FIG. 5.

With the memory device of the present embodiment, signals are generated by the circuit shown in FIG. 6. A fuse ROM 8 generates a signal f$_N$ which is always "H" to the normal memory cell column, while generating a signal f$_R$ which is always "L" to the defective memory cell column. This signal f$_R$ is to be the defective column address signal. These signals are supplied to NAND gates 32, 33. A clock signal $\phi_{CK}$ is also supplied to the other input terminals of the NAND gates 32, 33. This clock signal $\phi_{CK}$ is a signal alternated between the "H" level and the "L" level at a constant period. The output of the NAND gate 33, supplied with signal f$_N$ which is always at the "H" level, is a signal $\phi_n$ which is inverted from the clock signal $\phi_{CK}$. The output of the NAND gate 32, supplied with signal f$_R$ which is always at the "L" level, is a signal $\phi_r$ which, irrespective of the clock signal $\phi_{CK}$, is always at the "H" level.

Figure 5:
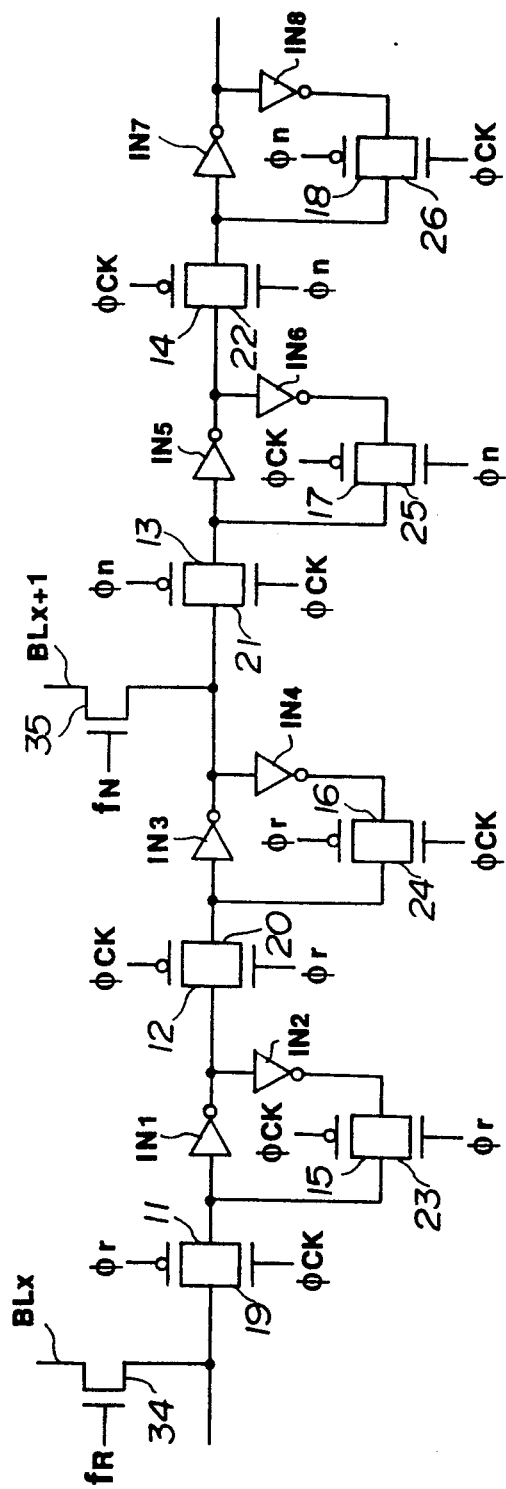
FIG. 5 is circuit diagram showing a modification of the terminal section of the shift register.

As shown in FIG. 5, the circuit construction of the present embodiment is such that latching occurs with falling of the clock signal $\phi_{CK}$ and control is made by the clock signal $\phi_{CK}$ and the signals $\phi_r$ and $\phi_n$ generated at the NAND gates 32, 33.

With the circuit of the present embodiment, the nMOS transistor 20 between the forward and rear stages of the D-flipflop associated with the defective memory cell column is always turned on by the signal $\phi_r$. Thus the data is not latched by but passed through the nMOS transistor through which the data is transferred in idleness. As a result, the circuitry for switching control, such as switching circuits or address comparators, may be eliminated to save the chip area. Since the control circuits are unnecessary, high-speed readout is also enabled.

Third Embodiment

The memory device of the present embodiment is an example of the video memory device in which defective bits are replaced by correlated data bits.

Figure 7:
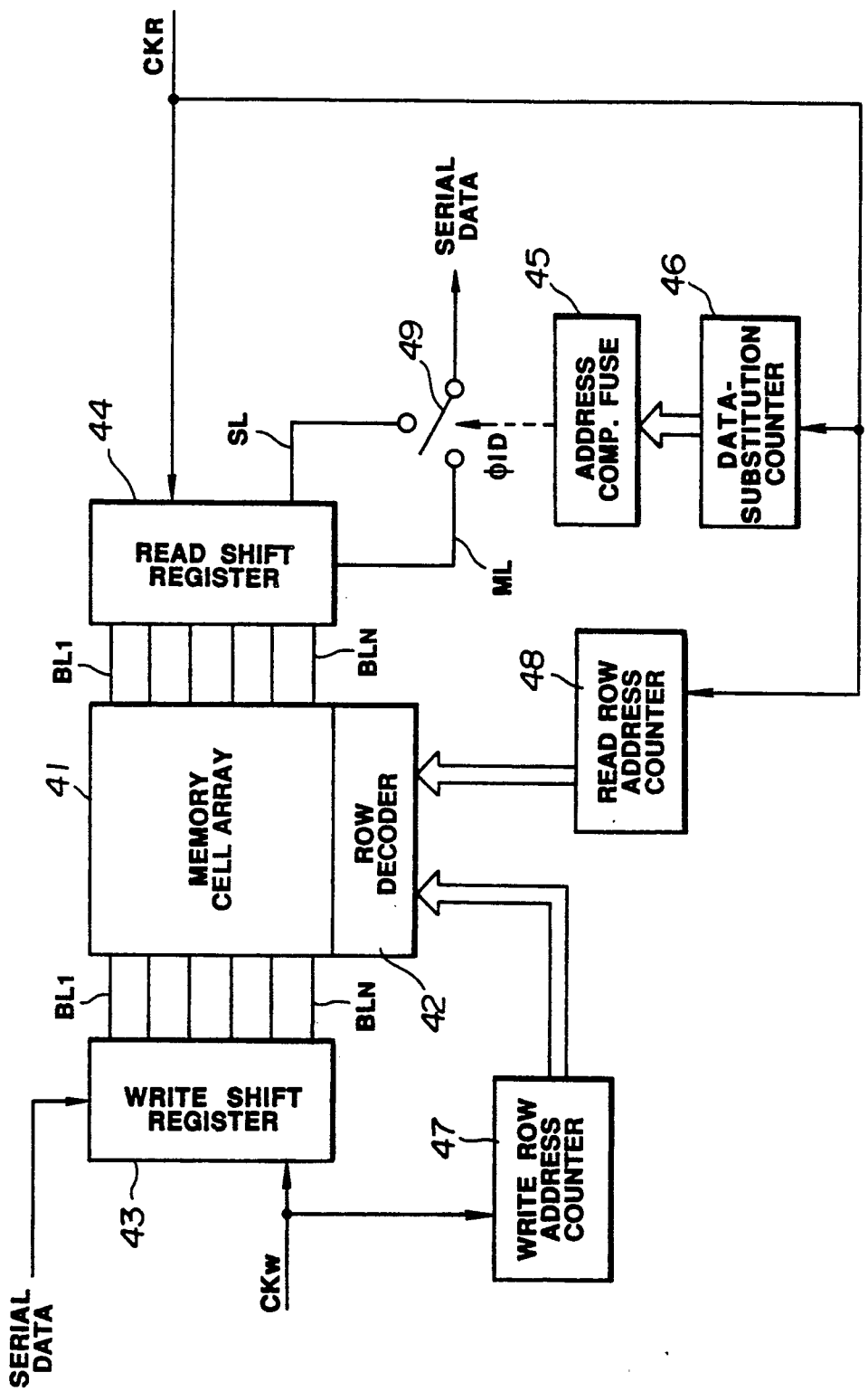
FIG. 7 is a block diagram showing another embodiment of the memory device of the present invention.

FIG. 7 shows the construction of the essential portions. The memory device of the present embodiment includes a memory cell array 41 having memory cells in a matrix configuration. In each memory cell of the memory cell array 41, there are stored video data, such as TV signals. In this memory cell array 41 are formed row-selecting word lines, not shown, each word line being selected by a row decoder 42.

An N number of bit lines BL$_1$ to BL$_N$, where N stands for a natural number, are formed at right angles to and in parallel with one another. These bit lines BL$_1$ to BL$_N$ are connected to both a write shift register 43 and a read shift register 44. The write shift register 43 is a register for converting serial data from outside into parallel data for transfer thereof to the memory cell array 41. For controlling the write shift register 43, white clock signal CK$_W$ is supplied to this write shift register 43. The read shift register 44 is a register for converting the parallel data from memory cell array 41 into serial data and reading out the serial data by means of readout line ML. A read clock signal CK$_R$ is supplied to this read shift register 44. As will be explained subsequently, the read shift register 44 of the present embodiment is provided with a wiring SL for substitution by a data one bit after and the erroneous data may be replaced by a data bit which is transmitted over the wiring SL.

The write clock signal CK$_W$ is supplied to both the write shift register 43 and a write row address counter circuit 47. The write row address counter circuit 47 counts the clocks of the write clock signal CK$_W$ and transmits the signal of the row address related with writing to row decoder 42. The read clock signal $CK_R$ is supplied to read shift register 44, while being supplied to both the read row address counter circuit 48 and the data substitution counter circuit 46. The read row address counter 48 counts the clocks of the read clock signals $CK_R$ to transmit the signal of the row address pertaining to reading to the row decoder 42. Since the present memory device is the video memory, address signals such as those of RAMs in general are not supplied, but row addresses are generated by the respective clock signals $CK_W$, $CK_R$.

The above described data-substituting counter circuit 46 is a circuit generating column addresses and, as it were, a circuit for counting the data shift state in the read shift register 44. The column addresses generated in the data-substituting counter circuit 46 are transmitted to an addresses comparator fuse circuit 45. The address comparator fuse circuit 45 includes a fuse ROM in which addresses for erroneous bits are stored in advance by the fuse melting pattern. The address comparator fuse circuit 45 also compares column addresses supplied from the data-substituting counter circuit 46 and the addresses of the erroneous bits from the fuse ROM. If the addresses coincide, the pulse of a signal $\phi_{ID}$ is generated.

The signal $\phi_{ID}$ controls the switching of a switch 49. The switch 49 is a changeover switch for selecting if the serial data outputted to outside should be taken from wiring SL or from reading line ML. Usually, the data from the reading line ML are transmitted to outside. However, if the pulse from the address comparator fuse circuit 45 should be generated in the signal $\phi_{ID}$, switch 49 is switched to the side of the wiring SL. As a result, the erroneous bit is replaced by a data bit which is one bit later.

Figure 8:
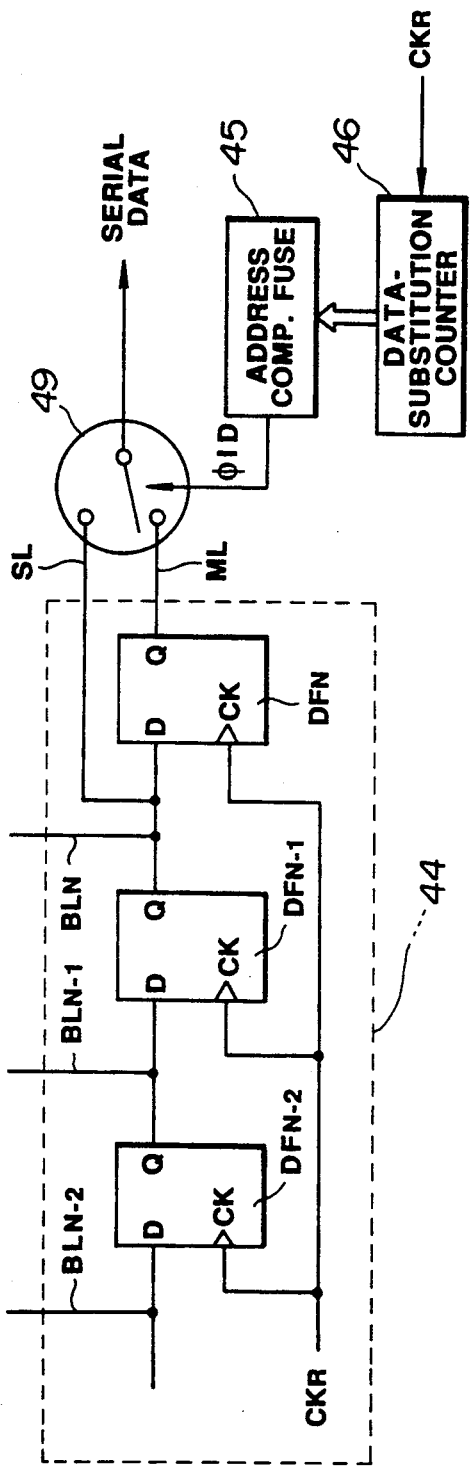
FIG. 8 is a circuit diagram showing a terminal portion of the shift register.
Figure 9:
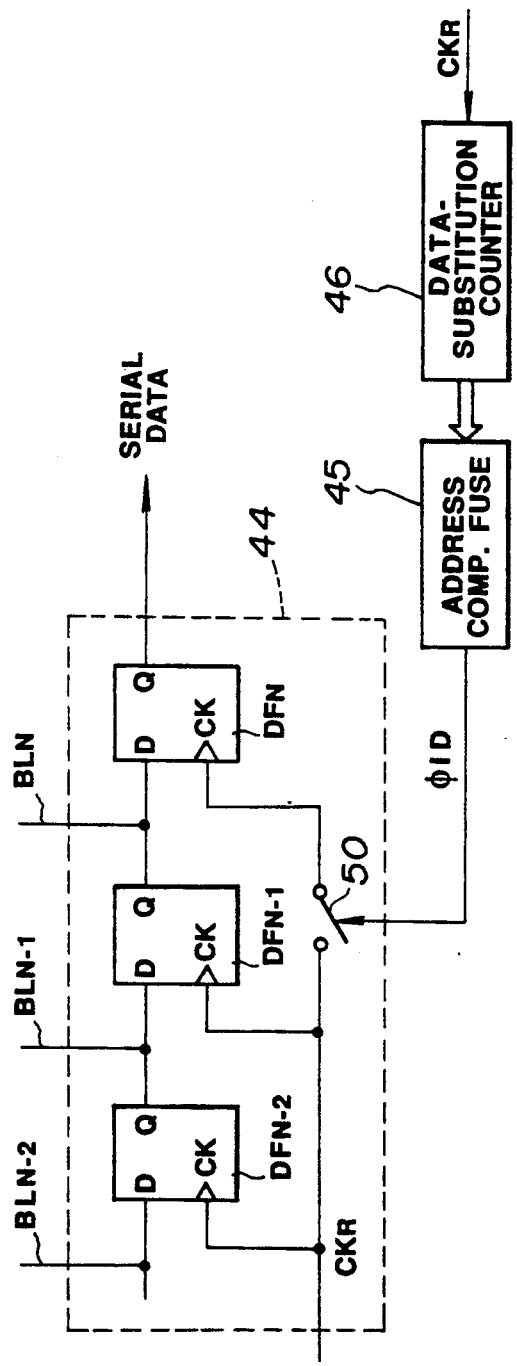
FIG. 9 is a circuit diagram showing a modification of the circuit of FIG. 8.
Figure 10:
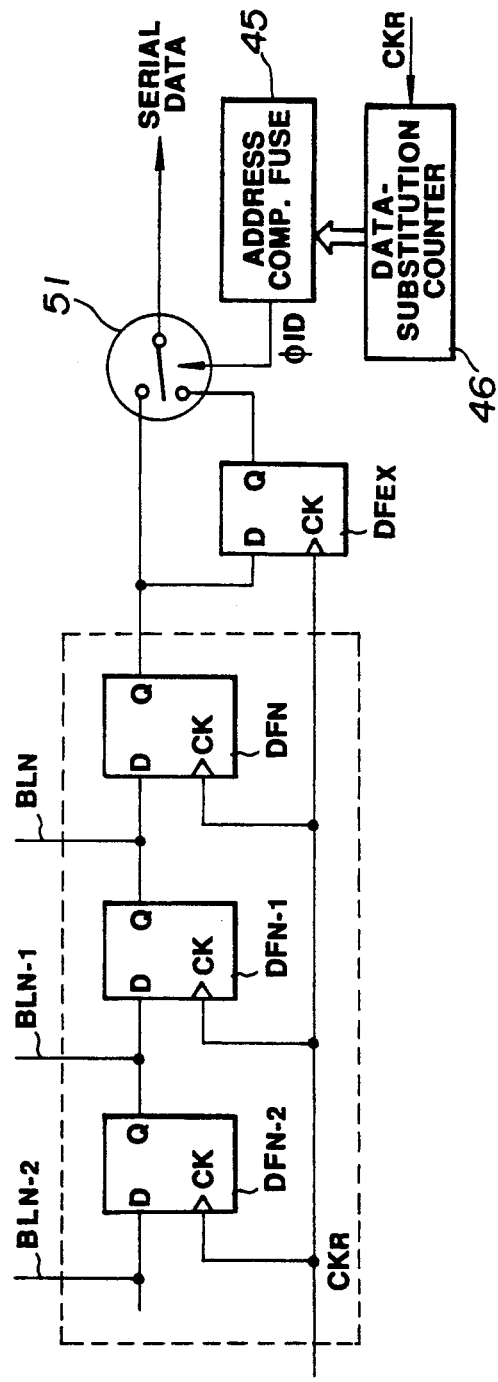
FIG. 10 is a circuit diagram showing another modification of the circuit of FIG. 8.

FIG. 8 shows the terminal portion of the read shift register 44 of the memory device of the present embodiment and its peripheral circuit. The read shift register 44 includes flipflop $DF_{N-2}$, $DF_{N-1}$ and $DF_N$ which are connected in series in its terminal portion. The bit line $BL_{N-2}$ is connected to the D terminal of the flipflop $DF_{N-2}$, the bit line $BL_{N-1}$ is connected to the D terminal of the flipflop $DF_{N-1}$ and the bit line $BL_N$ is connected to the D terminal of the flipflop $DF_N$. Read clock signals $CK_R$ are supplied to clock input terminals of the flipflop $DF_{N-2}$, $DF_{N-1}$ and $DF_N$. The Q terminal of the final stage flipflop $DF_N$ is to be the readout line ML and reading to outside is switchingly controlled by switch 49. The wiring SL is taken out from the D terminal of the final stage flipflop $DF_N$, that is, the Q terminal of the preceding flipflop $DF_{N-1}$. From this wiring SL, the next succeeding bit data is taken out without the intermediary of the final stage flipflop $DF_N$. The wiring SL is also switched by switch 49 so that the next succeeding bit data is outputted by means of the wiring SL only on occurrence of the pulse of the signal $\phi_{ID}$.

The operation of replacing the erroneous bit is explained briefly. First, data are transferred in shift register 44 in accordance with clocks of the read clock signals $CK_R$. At this time, the column addresses of the data-substituting counter circuit 46 are simultaneously incremented is accordance with clocks of the read clock signals $CK_R$. When the erroneous bits of the defective columns are latched by the final flipflop $DF_N$ and, with the timing appearing at the Q-terminals, the addresses from the fuse ROM in the previously stored address comparator fuse circuit 45 coincide with the column addresses from the data substituting counter circuit 46 and the output line connecting to the outside of the switch 49 is switched from the side of the reading line ML to the side of the wiring SL. The data bit appearing at the Q-terminal of the flipflop $DF_{N-1}$ of the preceding stage of the final stage is outputted at an output line without the intermediary of the last stage flipflop $DF_N$ so that the erroneous bit is not outputted. The data preceding the current data by one bit exhibits similarity because the video signals present correlation. Hence, when the image is viewed on a monitor, such substitution cannot be discovered by the human eye. After lapse of the time period when the erroneous bit appears at the Q-terminal of the final stage flipflop $DF_N$, the output line of the switch 49 is switched by the signal $\phi_{ID}$ from the wiring SL to the readout line ML so that the usual data shift operation is continued.

In this manner, with the memory device of the present embodiment, the features of the video data bearing original correlativeness are utilized for replacing the erroneous bit by the directly succeeding data bit. Thus the erroneous bit may be prevented from being outputted without providing a control system for redundant column or write side redundant circuits. Hence, the defective columns can be rescued without increasing chip area.

Meanwhile, any circuit construction may be used for the switch 49, if it is a semiconductor circuit provided on one and the same chip.

Fourth Embodiment

The present embodiment is a modification of the third embodiment and is an example in which read clock signals $CK_R$ are interrupted.

The present embodiment differs from the third embodiment in that the read clock signal $CK_R$ inputted to the last stage flipflop $DF_N$ is interrupted transiently without latching the erroneous data without substituting the bit of the flipflop $DF_{N-1}$ of the stage preceding the final stage by the switch 49.

That is, the read shift register 44 of the present embodiment is so constituted that a switch 50 is provided at a clock input terminal CK of the final stage flipflop $DF_N$, the read clock signals $CK_R$ are supplied to the final stage flipflop $DF_N$ on closure of switch 50 and the read clock signals $CK_R$ are not supplied to the final stage flipflop $DF_N$ on opening of the switch 50. The switch 50 is controlled by the signal $\phi_{ID}$ generated by the address comparator fuse circuit 45. The function of the address comparator fuse circuit 45 and the data substitution counter circuit 46 is similar to that of the third embodiment.

The erroneous bit replacing operation in the memory device of the present fourth embodiment is explained briefly. The switch 50 is normally closed and the bits are sequentially shifted in accordance with the clocks of the read clock signals $CK_R$. Immediately before the column defective data are transferred and the final stage flipflop $DF_N$ is about to latch the erroneous bit data, the pulse of the signal $\phi_{ID}$ is generated from the address comparator fuse circuit 45 to open the switch 50. The last stage flipflop $DF_N$ then ceases latching the data and the data outputted as the serial data are the same as the preceding bit. Thus the erroneous bit is not outputted, but is replaced by a one-bit preceding data which shows correlation with it. At the timing of transfer of the normal bit following the erroneous bit, the switch 50 is again closed by signal $\phi_{ID}$, so that the last stage flipflop $DF_N$ is returned to the data-latching state.

In this manner with the memory device having the above described circuit construction of the present invention, the features of the image data having intrinsic image correlation are utilized for replacing the erroneous bit by the directly preceding bit. Thus the erroneous bit may be prevented from being outputted without providing the redundant column or a control system for the write side redundant circuit. Thus the column defects can be remedied without increasing chip area.

Fifth Embodiment

The present embodiment is similarly a modification of the third embodiment in which a latch circuit is affixed to the final stage shift register.

The present embodiment differs from the third embodiment in that a flipflop $DF_{EX}$ is annexed next to the final stage flipflop $DF_N$ for storing one-bit-preceding data and, when the erroneous bit is about to be outputted, the output is switched to the side of the flipflop $DF_{EX}$ by the switch 51, without replacement by the bit of the last but one flipflop $DF_{N-1}$.

That is, the read shift register 44 of the memory device of the present embodiment includes a flipflop $DF_{EX}$ having its D-terminal connected to the Q terminal of the final stage flipflop $DF_N$. The Q terminal of the flipflop $DF_{EX}$ may be selected by switch 51. The read clock signal $CK_R$ is supplied to this annexed flipflop $DF_{EX}$, similarly to other flipflops. The switch 51 is provided for selectively outputting the output of the final stage flipflop $DF_N$ or the output of the annexed flipflop $DF_{EX}$ and is controlled by signal $\phi_{ID}$. Meanwhile, the address comparator fuse circuit 45 for generating the signal $\phi_{ID}$ or the data substitution counter circuit 46 are constructed similarly to those described previously.

With the memory device of the present embodiment, data of the Q terminal of the final stage flipflop $DF_N$ is outputted by means of switch 51. At this time, the annexed flipflop $DF_{EX}$ is operating for permanently storing the bit preceding the current bit by one bit.

When replacing the erroneous bit, switch 51 is switch to the side of the annexed flipflop $DF_{EX}$ at the timing of appearance of the erroneous bit at the Q-terminal of the final stage flipflop $DF_N$. As a result, as long as the erroneous bit data is latched by the last stage flipflop $DF_N$, the one-bit preceding data in the annexed flipflop $DF_{EX}$ is outputted for substitution of the erroneous bit.

With the above described memory device of the present embodiment, strong correlation proper to the video data is utilized for replacing the erroneous bit by the immediately preceding data bit. Thus the erroneous bit may be prevented from being outputted without providing the redundant column or the control system for the redundant circuit on the write side. Thus the defective column may be rescued without increasing chip area.

Although the erroneous bit is replace by the directly succeeding bit data or the directly preceding bit data in the third to fifth embodiments, the erroneous bit may also be replaced by bits of a directly preceding line, field or frame, by taking advantage of the correlation proper to the video signals.

What is claimed is:

1. A semiconductor memory device for storing video data, comprising:
   a memory cell array including a plurality of memory cells arranged in a matrix configuration, said memory cell array organized in a plurality of rows and a plurality of columns,
   a shift register including a plurality of serially connected flipflops for shifting data therein, said shift register connected to said columns via bit lines in parallel, and being capable of inputting or outputting data in parallel from or to said memory cell array and being also capable of outputting or inputting data in series to or from the outside of the device,
   control means for generating a control signal to control said shift register,
   wherein the data in said register are passed through to the next of said serially connected flipflops at one of said flipflops which is connected to a defective column by said control signal supplied from said control means.

2. A semiconductor memory device according to claim 1, wherein said register comprises one or more write register and one or more read register.

3. A semiconductor memory device according to claim 1, wherein said control means includes a fuse ROM for storing erroneous bit data of said defective column and a generator for generating said control signal by a logical process using a clock signal to shift the data in the register.

4. A semiconductor memory device according to claim 1, wherein a bit line between said flipflop relevant to said defective column and said memory cell array is cutoff, and said flipflop relevant to said defective is incapable of holding the data by said control signal.

5. A semiconductor memory device for storing video data, comprising:
   a memory cell array including a plurality of memory cells arrayed in a matrix,
   a read register being capable of inputting data in parallel from said memory cell array and being capable of outputting data in series,
   wherein erroneous data of a defective column of said memory cell array are replaced by correlative data at said read register.

6. A semiconductor memory device according to claim 5, wherein said read register includes a plurality of serially connected flipflops for shifting data therein.

7. A semiconductor memory device according to claim 6, wherein said read register has one main output terminal which is connected to an output side of the final stage flipflop of said read register and another output terminal which is connected to an input side of said final stage flipflop of said read register, and said erroneous data are replaced by selecting said another output terminal.

8. A semiconductor memory device according to claim 7, further comprising
   means for comparing an outputting data address signal with an erroneous data address signal stored in a fuse ROM, wherein erroneous data are replaced when said outputting data address signal is coincided with said erroneous data address signal.

9. A semiconductor memory device according to claim 6, wherein a switch is provided at an input of a clock signal of the final stage flipflop of said read register, and said erroneous data are replaced by a cutoff of said switch.

10. A semiconductor memory device according to claim 6, wherein a switch is provided at an input of a clock signal of the final stage flipflop of said read register, and said erroneous data are replaced by a cutoff of said switch.

11. A semiconductor memory device according to claim 6, wherein a latch circuit is provided at an output of said final stage flipflop of said read register, and said erroneous data are replaced by selecting an output of said latch circuit as an output terminal of said read register.

* * * * *